(12) United States Patent　　(10) Patent No.:　　US 7,775,727 B2
Hamasaki et al.　　　　　　　　(45) Date of Patent:　　Aug. 17, 2010

(54) OPTICAL MODULE AND MANUFACTURING METHOD OF THE SAME

(75) Inventors: Hiroshi Hamasaki, Hiratsuka (JP); Hideto Furuyama, Yokohama (JP); Hideo Numata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 72 days.

(21) Appl. No.: 12/130,585

(22) Filed: May 30, 2008

(65) Prior Publication Data

US 2008/0298745 A1　　Dec. 4, 2008

(30) Foreign Application Priority Data

May 31, 2007　　(JP)　　............... 2007-144898

(51) Int. Cl.
   *G02B 6/42*　　(2006.01)
(52) U.S. Cl. ........................................ 385/94
(58) Field of Classification Search .................... 385/94
   See application file for complete search history.

(56) References Cited

U.S. PATENT DOCUMENTS

| | | | |
|---|---|---|---|
| 5,390,271 A * | 2/1995 | Priest | 385/92 |
| 6,623,178 B1 * | 9/2003 | Sakurai et al. | 385/92 |
| 7,118,294 B2 | 10/2006 | Hamasaki et al. | |
| 7,255,493 B2 | 8/2007 | Hamasaki et al. | |
| 7,300,213 B2 | 11/2007 | Hamasaki et al. | |
| 7,352,935 B2 | 4/2008 | Furuyama et al. | |
| 2002/0037143 A1 | 3/2002 | Kuhara et al. | |
| 2005/0141824 A1 | 6/2005 | Furuyama et al. | |
| 2007/0081769 A1 | 4/2007 | Hamasaki et al. | |
| 2007/0165986 A1 | 7/2007 | Sakurai et al. | |

FOREIGN PATENT DOCUMENTS

EP　　1 548 475 A1　　6/2005

(Continued)

OTHER PUBLICATIONS

Hiroshi Hamasaki, et al., "Novel Optoelectronic LSI Packaging Suitable for Standard FR-4 Printed Wiring Board with Bandwidth Capability of Over 1 Tbps", IEEE, 56th Electronic Components and Technology Conference, 2006, pp. 298-302.

(Continued)

*Primary Examiner*—Jerry T Rahll
(74) *Attorney, Agent, or Firm*—Oblon, Spivak, McClelland, Maier & Neustadt, L.L.P.

(57) ABSTRACT

An optical module, including: an optical transmission line holding member having an optical semiconductor element mounting surface, an electrical interconnection layer formed on the mounting surface, and an optical transmission line guide hole with an opening on the mounting surface; an optical transmission line inserted into the guide hole; an optical semiconductor element, mounted on the mounting surface, having an electrode and a light-receiving or light-emitting area on a surface facing the mounting surface; an electrical connection portion which electrically connects the electrode and the interconnection layer, formed between the semiconductor element and the mounting surface; a first resin filling a space around the connection portion between the semiconductor element and the mounting surface; and a second resin filling a gap between the optical transmission line and the semiconductor element, with a property different from that of the first resin, and a method of manufacturing the module.

20 Claims, 4 Drawing Sheets

FOREIGN PATENT DOCUMENTS

| JP | 4-314362 | 11/1992 |
|----|----------|---------|
| JP | 2001-159724 | 6/2001 |
| JP | 2002-48951 | 2/2002 |
| JP | 2005-172989 | 6/2005 |
| JP | 2005-189604 | 7/2005 |

OTHER PUBLICATIONS

Wataru Sakurai, et al., "A Novel Optoelectronic Ferrule and Easy Ribbon Fiber Splicer for Cost-effective Optical Interconnection", IEEE, 8th Electronics Packaging Technology Conference, 2006, pp. 367-372.

Wataru Sakurai, et al., "A Novel Optoelectronic Ferrule for Cost-effective Optical Interconnection Modules", the 32nd ECOC, We3, 2006, 2 pages.

Wataru Sakurai, et al., "A Novel Optoelectronic Ferrule for Optical Interconnection Modules", the 11th OECC 6F1-1-1, 2006, pp. 1-2.

U.S. Appl. No. 12/252,702, filed Oct. 16, 2008, Hamasaki, et al.

\* cited by examiner

OPTICAL MODULE AND MANUFACTURING METHOD OF THE SAME

CROSS-REFERENCE TO RELATED APPLICATIONS

This application is based upon and claims the benefit of priority from the prior Japanese Patent Application No. 2007-144898, filed on May 31, 2007; the entire contents of which are incorporated herein by reference.

BACKGROUND OF THE INVENTION

In information and communication technology, it is widely performed that signals are transmitted by using light as a carrier by an intensity modulation, a phase modulation, and so on. For such an optical transmission, an optical coupling device is required, in order to optically couple an optical semiconductor element such as a light-emitting element and a light-receiving element with an optical transmission line such as an optical fiber.

In recent years, as electrical parasitic capacitance of the light-emitting element, light-receiving element, and the like has become nonnegligible in such optical coupling devices, in accordance with a speeding up of optical signals to be transmitted, a size of a light-emitting area or a light-receiving area of elements tends to become smaller. For example, a diameter of a light-receiving area of a GaAs pin-type photodiode is miniaturized to approximately 50 μm to 60 μm so as to obtain a response of more than 10 Gbps. The miniaturization of the light-emitting area or light-receiving area of the element described above incurs deterioration of optical coupling efficiency, and problems such as deterioration of noise resistance characteristics, and shortening of a transmission distance may occur. It might be also necessary to insert a lens in an optical line to allow a large tolerance for a relative position between the optical semiconductor element and the optical fiber. However, using a lens increases the number of components, makes the position adjustment between components more difficult, and increases a cost of manufacturing.

Accordingly, an optical coupling device using a so-called direct optical coupling (butt joint) method has been developed, wherein the light-emitting area or the light-receiving area of the optical semiconductor element and the optical transmission line are directly coupled without using any lens.

As such a device, an optical module is known, in which electrical interconnection layers are formed on one principal surface of an optical transmission line holding member for holding optical fibers, and an optical semiconductor element is mounted on the principal surface by flip-chip bonding with the light-emitting areas or the light-receiving areas thereof facing the optical fibers.

However, since the optical module described above uses the same resins for protecting a portion connecting the optical semiconductor element and the electrical interconnection layers, and for filling a gap between the optical semiconductor element and the optical fibers, the resin material should have not only the characteristics required for the underfill resin but also the optical characteristics. This leads to a problem that it limits the flexibility in a selection of resin materials and manufacturing conditions, and therefore increases the cost of manufacture.

BRIEF SUMMARY OF THE INVENTION

An aspect of the present invention relates to an optical module, including: an optical transmission line holding member having an optical semiconductor element mounting surface, an electrical interconnection layer formed on the optical semiconductor element mounting surface, and an optical transmission line guide hole with an opening on the optical semiconductor element mounting surface; an optical transmission line inserted into the optical transmission line guide hole; an optical semiconductor element mounted on the optical semiconductor element mounting surface having an electrode and a light-receiving or light-emitting area on a surface facing the optical semiconductor element mounting surface; an electrical connection portion which electrically connects the electrode and the electrical interconnection layer, formed between the optical semiconductor element and the optical semiconductor element mounting surface; a first resin filling a space around the electrical connection portion between the optical semiconductor element and the optical semiconductor element mounting surface; and a second resin filling a gap between the optical transmission line and the optical semiconductor element, the second resin having a property different from that of the first resin.

Another aspect of the present invention relates to a method of manufacturing an optical module, including: providing a first resin at an optical semiconductor element mounting surface of an optical transmission line holding member having the optical semiconductor element mounting surface, an electrical interconnection layer formed on the optical semiconductor element mounting surface, and an optical transmission line guide hole for guiding one end of an optical transmission line to the optical semiconductor element mounting surface, with at least a portion of the optical transmission line guide hole not provided the first resin; mounting an optical semiconductor element, which comprises an electrode and a light-receiving or light-emitting area, on the optical semiconductor element mounting surface on which the first resin has been provided, in such a way that the electrode and the light-receiving or light-emitting areas face the optical transmission line holding member, and electrically connecting the electrode and the electrical interconnection layer; and filling a second resin into a gap between the optical transmission line holding member including the optical transmission line inserted and the optical semiconductor element mounted on the optical semiconductor element mounting surface by inserting the optical transmission line after supplying the second resin to the optical transmission line guide hole.

DETAILED DESCRIPTION OF THE INVENTION

Hereinafter, embodiments according to the present invention are described by using the drawings. The embodiments of the present invention will be described using the drawings in the following, but these drawings are provided only for an illustrative purpose and by no means are intended to limit the present invention.

First Embodiment

Figure 1:
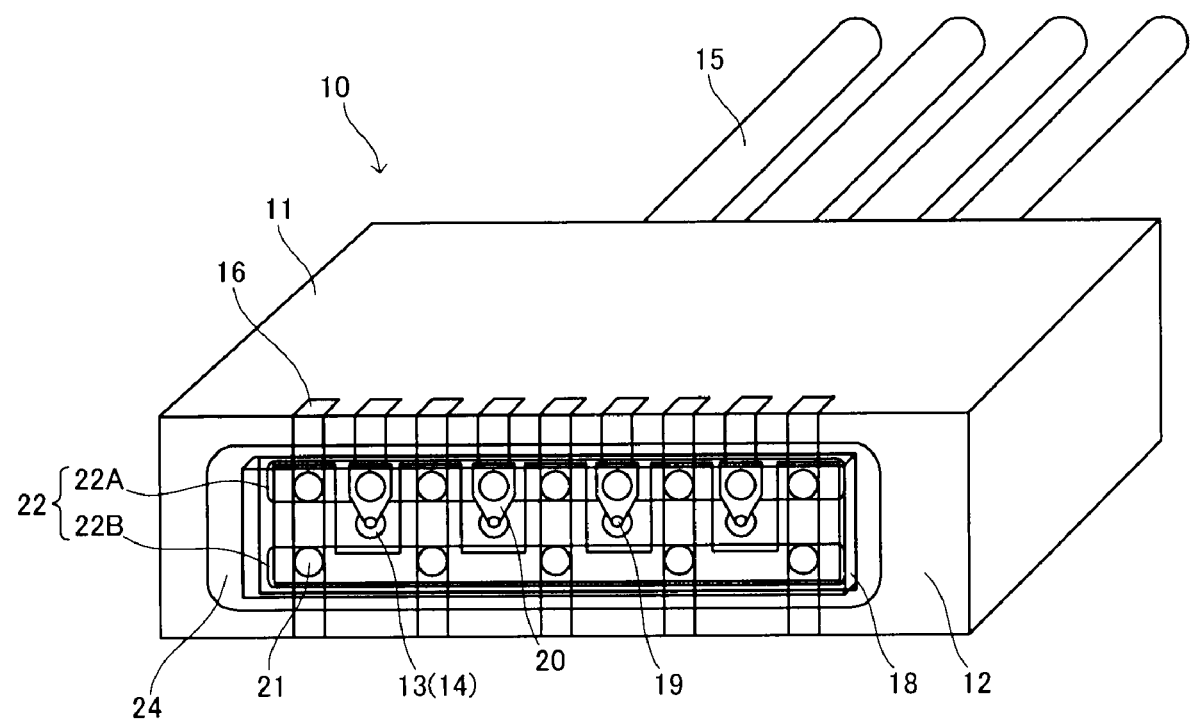
FIG. 1 is a perspective view showing an optical module according to a first embodiment.

FIG. 1 is a perspective view showing an optical module 10 according to a first embodiment of the present invention.

As shown in FIG. 1, the optical module 10 of the present embodiment includes optical fibers 15, an optical fiber holding member 11 holding these optical fibers 15, and an optical semiconductor element 18 mounted on the optical fiber holding member 11.

In FIG. 1, 11 represents the optical fiber holding member formed in approximately a rectangular parallelepiped shape by a thermosetting resin such as an epoxy resin, and one principal surface of the rectangular parallelepiped is taken as an optical semiconductor element mounting surface 12. The optical fiber holding member 11 may be formed by an injection molding of a thermoplastic resin such as, for example, LCP (liquid crystal polymer), and PPS (polyphenylene sulfide), and the shape thereof may be a regular hexahedron, a plate shape, and others without being limited to the rectangular parallelepiped. Besides, while a filler such as silica is generally blended with the above resin, but a type, an average particle size, a blending ratio, and other factors for blending can be appropriately selected on blending according to desired properties.

A plurality of through-holes 14 (four holes in the example of the drawing) having openings 13 on one side on the optical semiconductor element mounting surface 12 are provided in the optical fiber holding member 11 as an optical transmission line guide hole so that each opening 13 aligns with a given interval in a width direction of the optical semiconductor element mounting surface 12. Thus, these through-holes 14 are to guide one ends of the optical fibers 15 inserted from openings (not-shown) at the other side of each through-hole 14 to predetermined positions of the optical semiconductor element mounting surface 12. Consequently, a shape and other properties of the through-hole 14 are not limited, but it is preferably formed in a size and shape so that a positioning of the optical fibers 15 is possible. It is preferable that the through-holes 14 are to guide the optical fiber 15 in approximately parallel with an upper side surface and lower side surface of the optical fiber holding member 11; the through-holes 14 extend preferably in perpendicular to the optical semiconductor element mounting surface 12. Besides, a tapered portion of which the diameter increases toward the opening at the inserting side may be provided at an end portion of the through-holes 14 in insertion side for optical fiber 15, and the easy insertion of the optical fibers 15 to the through-holes 14 is attained owing to the tapered portion.

The optical semiconductor element mounting surface 12 of the optical fiber holding member 11 comprises electrical interconnection layers 16 including electrodes. The electrical interconnection layers 16 extend to the upper side surface and the lower side surface of the optical fiber holding member 11 and bend there at a right angle along the upper and lower side surface. Extension of the electrical interconnection layer 16 up to the upper side surface and the lower side surface is to connect the optical semiconductor element 18 to an external device such as a drive IC described below (by wire bonding, a flip-chip bonding, or the like). The electrical interconnection layers 16 can be formed by a sputtering, an electroless plating, and so on. Besides, they can also be formed by embedding a lead frame and exposing a cross section thereof to a side surface. In this case, since there is an advantage of easy formation, a three-dimensional process is not necessary.

The optical semiconductor element 18 is mounted by flip-chip bonding on the optical semiconductor element mounting surface 12 of the optical fiber holding member 11 which has been constituted as described above. The optical semiconductor element 18 may be either a light-emitting element or a light-receiving element. Examples include specifically a surface light-emitting element (a surface emitting laser etc.), and a photo diode. The optical semiconductor element 18 includes light-emitting areas or light-receiving areas 19 and electrodes 20 at a surface facing the optical semiconductor element mounting surface 12 of the optical fiber holding member 11, and they are mounted so that the light-emitting areas or light-receiving areas 19 face the corresponding openings 13 of the optical fiber holding member 11, and the electrodes 20 and the electrical interconnection layers 16 are electrically connected via bumps (for example, stud Au bumps, and solder bumps). An ultrasonic flip-chip bonding and others can be used for the connection between the electrodes 20 and the electrical interconnection layer 16. In FIG. 1, 21 represents an electrical connection portion between each electrode 20 of the optical semiconductor element 18 and the corresponding electrical interconnection layer 16.

A first resin 22 is formed so as to fill a space around the electrical connection portions 21 between the electrodes 20 of the optical semiconductor element 18 and the electrical interconnection layers 16, and a second resin 24 is formed so as to fill the gap between the optical fibers 15 and the optical semiconductor element 18. More specifically, the first resin 22 forms a first island 22A filling a space around the electrical connection portions 21 located above the aligned openings 13 in a strip form, and a second island 22B filling a space around the electrical connection portions 21 located below the aligned openings 13 in a strip form. Besides, the second resin 24 is formed so as to fill space between these first island 22A and second island 22B.

The first resin 22 protects and reinforces the electrical connection portions 21 between the electrodes 20 of the optical semiconductor element 18 and the electrical interconnection layers 16 formed on the optical fiber holding member 11. For the first resin 22, a resin material containing a resin such as epoxy, urethane and silicone as a base component, which are excellent in, for example, underfill function such as a stress relaxation performance, and fine particles of metal oxides such as silica and alumina as a filler component may be used. For the second resin 24, for example, a resin material containing a resin such as silicone, acrylate, and epoxy having a optical transparency for light emitted from the optical semiconductor element 18 or for light received by the optical semiconductor element 18 may be used. It is preferable that the second resin 24 has an approximately the same refractive index (absolute refractive index) as the cores of the optical fibers 15. The second resin 24 having approximately the same refractive index as the cores of the optical fibers 15, for example, difference in the refractive index within ±5% relative to the cores of the optical fibers 15, suppresses reflected returning light at an interface between the cores of the optical fibers 15 and the second resin 24.

The method of manufacturing for the above optical module 10 is described by using the drawings.

Figure 2A:
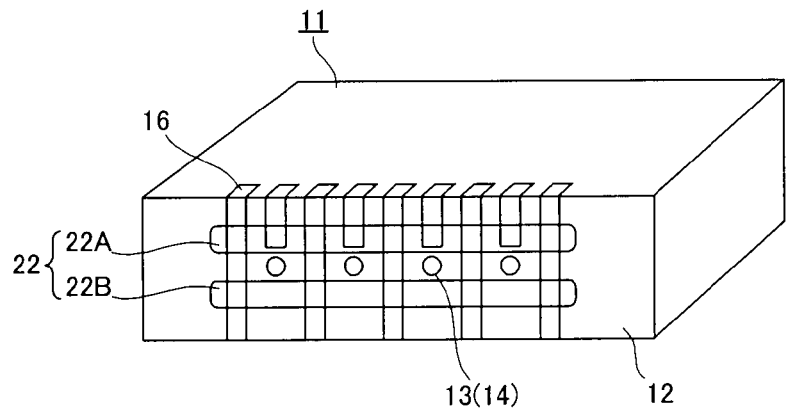
FIG. 2A to FIG. 2C are perspective views illustrating a method of manufacturing the optical module shown in FIG. 1.
Figure 2B:
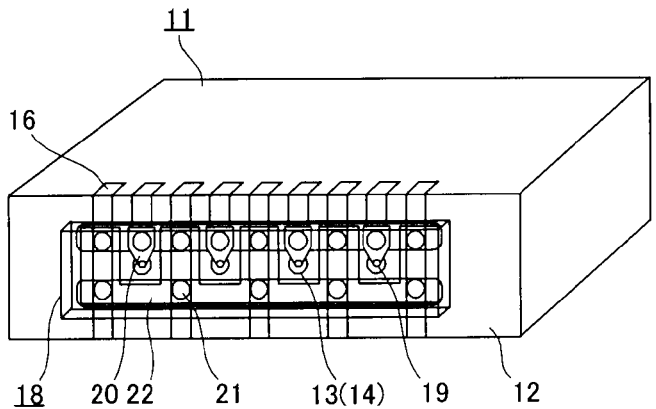
Figure 2C:
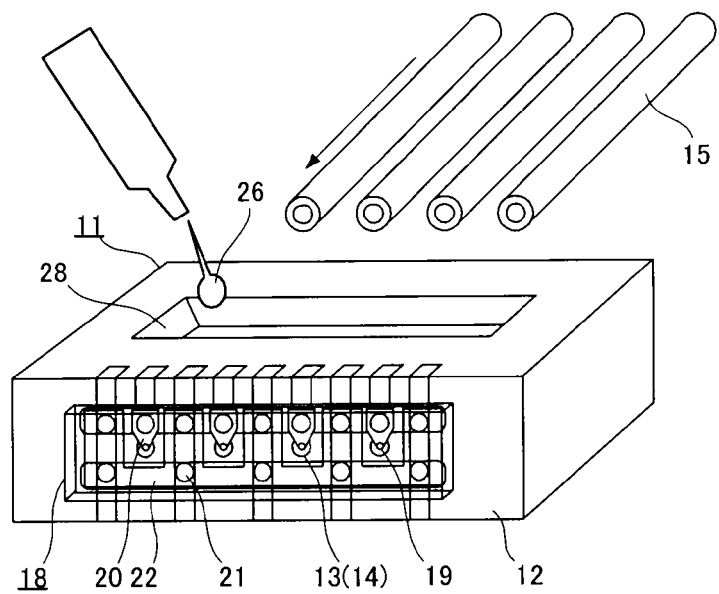

FIGS. 2A to 2C are perspective views to illustrate the method of manufacturing for the optical module in FIG. 1.

As shown in FIG. 2A, the optical fiber holding member 11 in which the electrical interconnection layers 16 including the electrode pads are formed at the optical semiconductor element mounting surface 12 is prepared at first, and then the first resin 22 comprising the first island 22A and the second island 22B is formed on the optical semiconductor element mounting surface 12. The first resin 22 may be formed by coating using a dispenser and the like when a resin material is used in the form of paste, or in the form having a viscosity too high to flow, or by attaching a resin sheet punched out in a predetermined shape when a resin material is used in a form of sheet.

Then, as shown in FIG. 2B, centers of the light-receiving (or light-emitting) areas 19 of the optical semiconductor element 18 are adjusted to centers of the openings 13 of the optical fiber holding member 11, and the electrodes 20 of the optical semiconductor element 18 and the electrical interconnection layers 16 of the optical fiber holding member 11 are coupled by, for example, the bump bursting through the first resin 22. In reverse procedure, after the optical semiconductor element 18 is mounted on the optical semiconductor element mounting surface 12 so that the electrodes 20 of the optical semiconductor element 18 and the electrical interconnection layers 16 of the optical fiber holding member 11 are electrically connected, the first and second islands 22A, 22B of the first resin 22 may be formed by injecting the first resin 22 into the space around the electrical connection portion of the bumps and the like in the gaps between the optical semiconductor element 18 and the optical fiber holding member 11.

Then, a resin 26, a material of the second resin 24 is supplied to the through-holes 14 of the optical fiber holding member 11, as shown in FIG. 2C. When the resin 26 is supplied, it may be injected from a resin inlet 28 provided in advance at a main body of the optical fiber holding member 11, as shown in the same drawing, or it may be injected from the openings at the optical fiber inserting side of the through-holes 14. The injection from the resin inlet 28 is preferable from a point of view that a desired amount can be injected easily. Before the injected resin 26 is cured, the optical fibers 15 should be inserted from the opening of the through-holes 14 at the optical fiber inserting side until end portions thereof reach the openings 13 of the optical semiconductor element mounting surface 12. A part of the injected resin 26 is pushed out of the openings 13 by pushing in the optical fibers 15, and the resin 26 is filled into the gaps between optical fibers 15 and the optical fiber holding member 11, and the optical semiconductor element 18, and thereby, the second resin 24 is formed.

In this process, since the space between the strip-formed first island 22A and the strip-formed second island 22B functions as an air vent hole, the resin 26 is smoothly pushed out of the openings 13, so as to fully fill the gaps between the optical fiber holding member 11 and the optical semiconductor element 18, resulting in formation of second resin 24 having excellent optical properties without bubbles. If a space to be filled by the second resin 24 is substantially sealed by the first resin 22 and others, there is no escaping vent for air, which makes it difficult to fill the resin and leaves bubbles in the resin. In the present embodiment, since the space to be filled by the second resin 24 is open to the outside, the air is pushed out toward outside, which makes it possible to fill the resin smoothly, and form a resin layer without bubbles. Curing of the resin left in the through-hole 14 hold the optical fiber 15.

In the optical module according to the first embodiment, since different type of resins can be used for protecting the electrical connection portions 21 between the optical semiconductor element 18 and the electrical interconnection layers 16 of the optical fiber holding member 11 and for filling the gap between optical fibers 15 and the light-receiving (or light-emitting) areas 19 of the optical semiconductor element 18, it is possible to use a resin with a property required for the underfill resin for the former, and use a resin with a excellent optical characteristics for the latter. As a result, it is not necessary to use an expensive resin having both the properties required for the underfill resin and the good optical characteristics as in a conventional case, which enables the reduction of cost.

Further, in the optical module, as the electrical interconnection layers 16 extend out to the upper and lower side surfaces adjacent to the optical semiconductor element mounting surface 12, a bonding is free from influence even if the first resin 22 or the second resin 24 may be softened and melted to flow and cover the electrical interconnection layers 16 on the optical semiconductor element mounting surface 12.

In the embodiment described above, while the first resin 22 comprises the first island 22A fills the space around the electrical connection portions 21 located above the aligned openings 13, and the second island 22B fills the space around the electrical connection portions 21 located below the aligned openings 13 as shown FIG. 1, the configuration of the first resin 22 is not limited to those shown in FIG. 1, but all that is required is that the first resin 22 is disposed so as to leave a void space which connects each openings 13 to the outside along the optical semiconductor element mounting surface 12.

Figure 3:
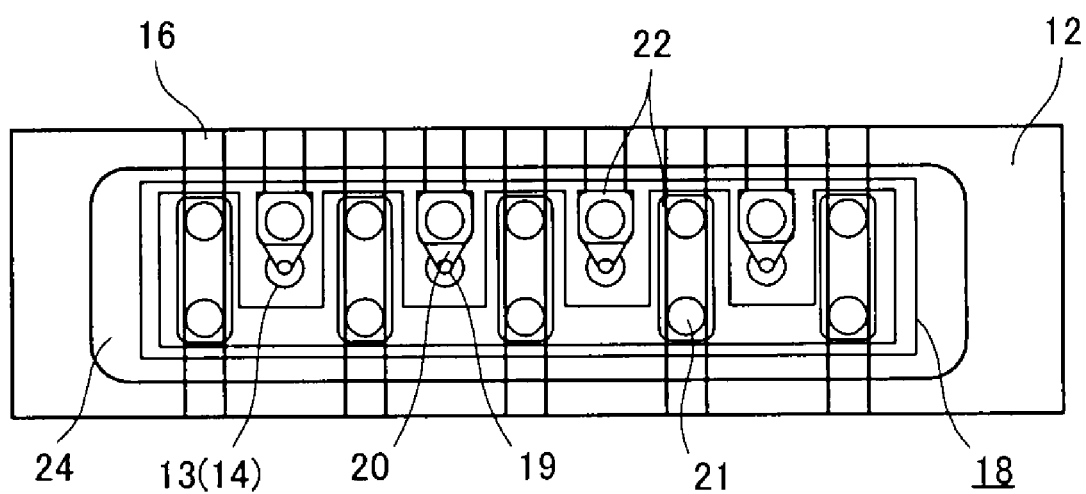
FIG. 3 is a view illustrating a modified example of the first embodiment.

An example is shown in FIG. 3. The first resin 22 fills the space around the electrical connection portions 21 located at both sides of the alignment of openings 13 and the electrical connection portions 21 located above the openings 13 respectively and independently. In this case, bubbles in the second resin 24 may be controlled more easily because vent for air is formed for each openings 13, although higher accuracy is required for the coating or the attaching the resin material compared to the example shown in FIG. 1 in which the first resin 22 comprises two islands, the first island 22A and the second island 22B.

Second Embodiment

Figure 4:
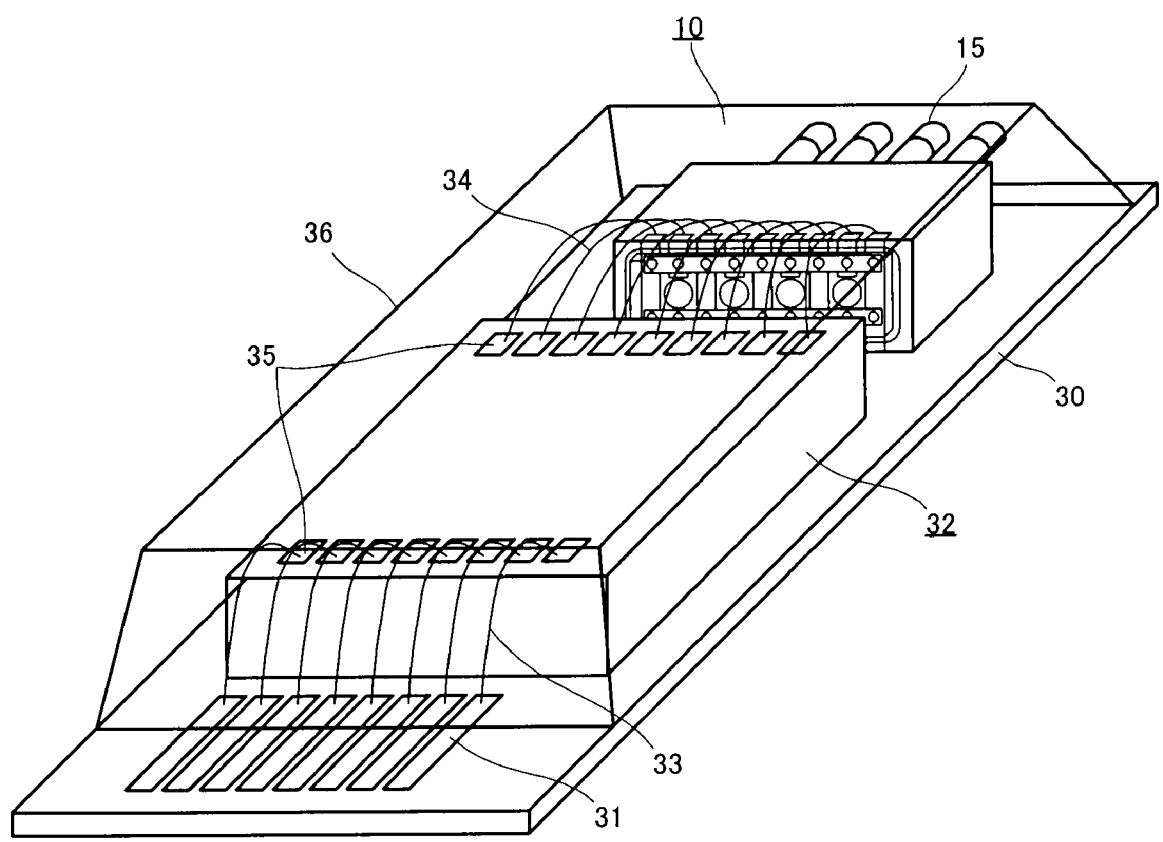
FIG. 4 is a perspective view showing an optical module according to a second embodiment with a transparent view for a part thereof.

FIG. 4 is a perspective view showing an optical module according to a second embodiment. In the optical module, the optical module 10 shown in FIG. 1 is mounted on a substrate together with external devices, and they are resin sealed.

In FIG. 4, 30 represents the substrate, with interconnection layers 31 formed on one principal surface of the substrate 30. The substrate 30 also has external terminals electrically connected to the interconnection layers 31, though not shown.

A semiconductor chip (a drive IC) 32 having a built-in circuit to drive the optical module 10 is mounted on one principal surface of the substrate 30 together with the optical module 10 shown in FIG. 1. The semiconductor chip (the drive IC) 32 may be, for example, a semiconductor chip amplifying signals (an amplifier IC) and the like. The semiconductor chip 32 is electrically connected to the interconnection layers 31 of the substrate 30 by bonding wires 33, and also electrically connected to the electrical interconnection layers 16 of the optical module 10 by bonding wires 34. As the optical semiconductor element 18 of the optical module 10 is electrically connected to the electrical interconnection layers 16, the optical semiconductor element 18 and the semiconductor chip 32 are electrically connected via the electrical interconnection layers 16. The optical module 10 may also be electrically connected to the interconnection layers 31 of the substrate 30. In FIG. 4, 35 represents electrodes provided on the semiconductor chip 32, and 36 represents a molding resin which seals the semiconductor chip 32, the optical module 10, the interconnection layers 31, and electrical connection portions of the above. In FIG. 4, the molding resin 36 is shown only by lines in order to show an internal structure in the drawing. For example, resins such as an thermosetting epoxy and a biphenyl type resins are used for the molding resin 36.

Comparing to the conventional optical modules, the cost reduction may be possible for the optical module configured above, wherein the optical module 10 shown in FIG. 1 is used.

In the embodiment, the optical module 10 may have the structure, for example, as described in FIG. 3.

The present invention is not limited to the description in the above embodiments, but it is to be understood that the structure and materials as well as the configuration of members can be changed without departing from the scope and spirit of the invention.

What is claimed is:

1. A method of manufacturing an optical module, comprising:
    providing a first resin on an optical semiconductor element mounting surface of an optical transmission line holding member having the optical semiconductor element mounting surface, an electrical interconnection layer formed on the optical semiconductor element mounting surface, and an optical transmission line guide hole with an opening on the optical semiconductor element mounting surface, with at least a portion of the optical transmission line guide hole not provided the first resin;
    mounting an optical semiconductor element, which comprises an electrode and a light-receiving or light-emitting area, on the optical semiconductor element mounting surface on which the first resin has been provided, in such a way that the electrode and the light-receiving or light-emitting area face the optical transmission line holding member, and electrically connecting the electrode and the electrical interconnection layer; and
    filling a second resin into a gap between the optical transmission line holding member including the optical transmission line inserted and the optical semiconductor element mounted on the optical semiconductor element mounting surface by inserting the optical transmission line after supplying the second resin to the optical transmission line guide hole,
    wherein
    the first resin is provided so that the optical transmission line guide hole is open to the outside on the optical semiconductor element mounting surface; and
    the first resin is provided so that islands spaced from each other are formed on the optical semiconductor element mounting surface.

2. A method of manufacturing an optical module, comprising:
    providing a first resin on an optical semiconductor element mounting surface of an optical transmission line holding member having the optical semiconductor element mounting surface, an electrical interconnection layer formed on the optical semiconductor element mounting surface, and an optical transmission line guide hole with an opening on the optical semiconductor element mounting surface, with at least a portion of the optical transmission line guide hole not provided the first resin;
    mounting an optical semiconductor element, which comprises an electrode and a light-receiving or light-emitting area, on the optical semiconductor element mounting surface on which the first resin has been provided, in such a way that the electrode and the light-receiving or light-emitting area face the optical transmission line holding member, and electrically connecting the electrode and the electrical interconnection layer, the first resin serving to protect and reinforce the electrical connection between the electrode and the electrical interconnection layer; and
    filling a second resin into a gap between the optical transmission line holding member including the optical transmission line inserted and the optical semiconductor element mounted on the optical semiconductor element mounting surface by inserting the optical transmission line after supplying the second resin to the optical transmission line guide hole, the second resin having optical transparency for light passing between the optical transmission line and the optical semiconductor element and being different than the first resin
    wherein the first resin is provided so that the optical transmission line guide hole is open to the outside on the optical semiconductor element mounting surface.

3. The method according to claim 2, wherein the first resin is not provided at the two sides of the opening of the optical transmission line guide hole in the width direction of the optical semiconductor element mounting surface.

4. An optical module, comprising:
    an optical transmission line holding member having an optical semiconductor element mounting surface, an electrical interconnection layer formed on the optical semiconductor element mounting surface, and an optical transmission line guide hole with an opening on the optical semiconductor element mounting surface;
    an optical transmission line inserted into the optical transmission line guide hole;
    an optical semiconductor element mounted on the optical semiconductor element mounting surface having an electrode and a light-receiving or light-emitting area on a surface facing the optical semiconductor element mounting surface;
    an electrical connection portion which electrically connects the electrode and the electrical interconnection layer, formed between the optical semiconductor element and the optical semiconductor element mounting surface;
    a first resin which protects and reinforces the electrical connection portion filling a space around the electrical connection portion between the optical semiconductor element and the optical semiconductor element mounting surface; and
    a second resin having optical transparency for light passing between the optical transmission line and the optical semiconductor element filling a gap between the optical transmission line and the optical semiconductor element, the second resin being different than the first resin
    wherein
    the first resin fills the space around the electrical connection portion while leaving a space where the optical transmission line guide hole is open to the outside on the optical semiconductor element mounting surface, and
    the second resin fills the gap between the optical transmission line and the optical semiconductor element, and the space between the optical semiconductor element and the optical semiconductor element mounting surface.

5. The optical module according to claim 4, wherein the first resin is divided into at least two portions.

6. The optical module according to claim 4, wherein the first resin is not disposed at the two sides of the opening of the optical transmission line guide hole in the width direction of the optical semiconductor element mounting surface.

7. The optical module according to claim 4, wherein the second resin is partially surrounded by the first resin on the optical semiconductor element mounting surface.

8. The optical module according to claim 4, wherein the second resin has a refractive index approximately equal to the refractive index of the optical transmission line.

9. The optical module according to claim 4, wherein the optical transmission line guide hole comprises a plurality of through-holes extending in a direction perpendicular to the optical semiconductor element mounting surface, each of the through-holes having an opening on the optical semiconductor element mounting surface.

10. The optical module according to claim 9, wherein the openings of the through-holes are aligned in a width direction of the optical semiconductor element mounting surface with a given interval.

11. The optical module according to claim 4, wherein
the optical transmission line holding member has an upper side surface and a lower side surface perpendicular to the optical semiconductor element mounting surface, and
the electrical interconnection layer extends to the upper and lower side surfaces.

12. The optical module according to claim 4, wherein the optical semiconductor element is mounted on the optical semiconductor element mounting surface by flip-chip bonding.

13. The optical module according to claim 4, wherein the second resin has a refractive index which differs from the refractive index of the optical transmission line by ±5%.

14. An optical module, comprising:
an optical transmission line holding member having an optical semiconductor element mounting surface, an electrical interconnection layer formed on the optical semiconductor element mounting surface, and an optical transmission line guide hole with an opening on the optical semiconductor element mounting surface;
an optical transmission line inserted into the optical transmission line guide hole;
an optical semiconductor element mounted on the optical semiconductor element mounting surface having an electrode and a light-receiving or light-emitting area on a surface facing the optical semiconductor element mounting surface;
an electrical connection portion which electrically connects the electrode and the electrical interconnection layer, formed between the optical semiconductor element and the optical semiconductor element mounting surface;
a first resin filling a space around the electrical connection portion between the optical semiconductor element and the optical semiconductor element mounting surface; and
a second resin filling a gap between the optical transmission line and the optical semiconductor element, the second resin having a property different from that of the first resin,
wherein the first resin is disposed to form islands spaced from each other.

15. The optical module according to claim 14, wherein the islands are spaced from each other in the height direction of the optical semiconductor element mounting surface.

16. The optical module according to claim 14, wherein the islands are spaced from each other in the width direction of the optical semiconductor element mounting surface.

17. The optical module according to claim 14, wherein
the first resin fills the space around the electrical connection portion while leaving a space where the optical transmission line guide hole is open to the outside on the optical semiconductor element mounting surface, and
the second resin fills the gap between the optical transmission line and the optical semiconductor element, and the space between the optical semiconductor element and the optical semiconductor element mounting surface.

18. The optical module according to claim 14, wherein the second resin is partially surrounded by the first resin on the optical semiconductor element mounting surface.

19. The optical module according to claim 14, wherein the first resin is divided into at least two portions.

20. The optical module according to claim 14, wherein the first resin is not disposed at the two sides of the opening of the optical transmission line guide hole in the width direction of the optical semiconductor element mounting surface.

* * * * *